(12) United States Patent
Nagatomo et al.

(10) Patent No.: US 8,149,892 B2
(45) Date of Patent: Apr. 3, 2012

(54) STRUCTURE HAVING PHOTONIC CRYSTAL AND SURFACE-EMITTING LASER

(75) Inventors: Yasuhiro Nagatomo, Hachioji (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 138 days.

(21) Appl. No.: 12/183,122

(22) Filed: Jul. 31, 2008

(65) Prior Publication Data

US 2009/0074026 A1  Mar. 19, 2009

(30) Foreign Application Priority Data

Aug. 8, 2007 (JP) .................................. 2007-206984

(51) Int. Cl.
*H01S 3/08* (2006.01)
*H01S 5/00* (2006.01)

(52) U.S. Cl. ........................... 372/99; 372/92; 372/43.01

(58) Field of Classification Search ........................ None
See application file for complete search history.

(56) References Cited

U.S. PATENT DOCUMENTS

| | | | | |
|---|---|---|---|---|
| 6,404,947 | B1 * | 6/2002 | Matsuda | 372/50.1 |
| 6,853,669 | B2 * | 2/2005 | Simpson et al. | 372/92 |
| 7,009,216 | B2 * | 3/2006 | Otsuka et al. | 372/50.11 |
| 7,295,745 | B2 | 11/2007 | Uchida | 385/129 |
| 2001/0019565 | A1 * | 9/2001 | Iwasaki et al. | 372/43 |
| 2005/0111511 | A1 | 5/2005 | Assefa et al. | 372/92 |
| 2007/0036189 | A1 | 2/2007 | Hori et al. | 372/50.11 |
| 2007/0201527 | A1 | 8/2007 | Hori et al. | 372/50.124 |
| 2008/0031297 | A1 | 2/2008 | Uchida | 372/45.01 |
| 2008/0117941 | A1 | 5/2008 | Nagatomo | 372/19 |
| 2008/0117942 | A1 | 5/2008 | Nagatomo et al. | 372/19 |
| 2008/0205462 | A1 | 8/2008 | Uchida | 372/34 |
| 2009/0285255 | A1 | 11/2009 | Sakai et al. | 372/50.124 |

FOREIGN PATENT DOCUMENTS

| | | |
|---|---|---|
| CN | 1602569 A | 3/2005 |
| JP | 2000-332351 A | 11/2000 |
| JP | 2001-308457 A | 11/2001 |
| JP | 2003-273456 A | 9/2003 |
| JP | 2003-273460 A | 9/2003 |
| JP | 2007-258262 A | 10/2007 |

OTHER PUBLICATIONS

S. Boutami et al., "Compact 1.55 μm room-temperature optically pumped VCSEL using photonic crytsal mirror," Electronic Letters, vol. 43, No. 5, Mar. 1, 2007, pp. 282-283.

(Continued)

*Primary Examiner* — Jessica Stultz
*Assistant Examiner* — Sean Hagan
(74) *Attorney, Agent, or Firm* — Fitzpatrick, Cella, Harper & Scinto

(57) ABSTRACT

In a structure having a two-dimensional photonic crystal in which structures having different refractive indices are disposed at a two-dimensional period and comprising a structure emitting in a direction perpendicular to a resonance direction of light propagating in the in-plane direction of the two-dimensional photonic crystal, wherein the structure comprises a one-dimensional photonic crystal in which components having different refractive indices are arranged at a one-dimensional period, and, the light propagating in the in-plane direction of the two-dimensional photonic crystal is reflected by a photonic band edge of the one-dimensional photonic crystal.

6 Claims, 8 Drawing Sheets

OTHER PUBLICATIONS

X. Letartre et al., "Switching Devices With Spatial and Spectral Resolution Combining Photonic Crystal and MOEMS Structures," Journal of Lightwave Technology, vol. 21, No. 7, Jul. 2003, pp. 1691-1699.

S. Fan et al., "Analysis of guided resonances in photonic crystal slabs", The American Physical Society, Physical Review B, vol. 65, No. 235112, 2002, pp. 235112-1 to 235112-8.

Office Action dated Nov. 23, 2011, issued in counterpart Chinese Patent Application No. 200810145337.6, with translation.

S. Kim et al., "Ultracompact High-Efficiency Polarizing Beam Splitter with a Hybrid Photonic Crystal and Conventional Waveguide Structure", *Optics Letters*, vol. 28, No. 23, pp. 2384-2386 (Dec. 1, 2003).

\* cited by examiner

EVEN MODES

ODD MODES

STRUCTURE HAVING PHOTONIC CRYSTAL AND SURFACE-EMITTING LASER

BACKGROUND OF THE INVENTION

1. Field of the Invention

The present invention relates to a structure having a photonic crystal, and a surface-emitting laser including a structure having a photonic crystal.

2. Description of the Related Art

In recent years, many examples of photonic crystals applied to semiconductor lasers have been reported. Japanese Patent Application Laid-Open No. 2000-332351 discloses a surface-emitting laser light source in which an active layer containing a light-emitting material is provided and a two-dimensional photonic crystal is formed in the vicinity of the active layer.

This two-dimensional photonic crystal is periodically provided with a columnar hole on a semiconductor layer, and has two-dimensional periodicity in distribution of a refractive index.

Because of this periodicity, the light generated in the active layer is resonated in harmony, and forms a stationary wave, thereby to perform a laser oscillation.

Further, the light is extracted in the perpendicular direction to the plane by primary diffraction, thereby to be allowed to work as a surface-emitting laser.

In the surface-emitting laser including such a photonic crystal, when a size of the two-dimensional photonic crystal is limited, a leakage of the light occurs in an in-plane direction. Such a leaked light in the in-plane direction causes losses, and leads to the increase in oscillation threshold value and the lowering of an optical output.

Hence, heretofore, Japanese Patent Application Laid-Open No. 2003-273456 has proposed a two-dimensional photonic crystal light-emitting laser in which a structure allowing the light leaked in the in-plane direction to reflect by using a photonic band gap is disposed around a two-dimensional photonic crystal.

As a result, the light leaking in the in-plane direction is returned to the inside of a region of the two-dimensional photonic crystal.

As described above, in the photonic crystal surface-emitting laser, when a size of the two-dimensional photonic crystal is limited, a leakage of the light occurs in the in-plane direction.

To prevent this leakage, when the photonic crystal is made large, there arises a problem that a size of the device becomes large.

Further, similarly to Japanese Patent Application Laid-Open No. 2003-273456, even in the case that the structure reflecting the light leaked in the in-plane direction is disposed around the photonic crystal, the following problem occurs.

That is, Japanese Patent Application Laid-Open No. 2003-273456 employs a structure wherein the light leaked in the in-plane direction is reflected by utilizing the photonic band gap.

In such a structure, since the light is reflected by multiple reflection by a periodic structure, as the necessary reflectance is increased, the necessary number of periods is increased, and as a result, there arises a problem that the size ends up becoming large.

In view of the above described problem, an object of the present invention is to provide a structure having a photonic crystal capable of reflecting efficiently the light leaked in the in-plane direction in small size and being re-used and a surface-emitting laser including a structure having a photonic crystal.

SUMMARY OF THE INVENTION

The present invention provides a structure having a photonic crystal and a surface-emitting laser including a structure having a phonic crystal.

The present invention is directed to a structure having a two-dimensional photonic crystal in which structures having different refractive indices are disposed at a two-dimensional period and comprising a structure emitting in a direction perpendicular to a resonance direction of light propagating in the in-plane direction of the two-dimensional photonic crystal, wherein the structure comprises a one-dimensional photonic crystal in which components having different refractive indices are arranged at a one-dimensional period, and, the light propagating in the in-plane direction of the two-dimensional photonic crystal is reflected by a photonic band edge of the one-dimensional photonic crystal.

The one-dimensional photonic crystal can be provided in the direction perpendicular to the emitting direction of the light out of the region of the two-dimensional photonic crystal in the structure, and moreover, in the direction perpendicular to the resonance direction of the light, and, the light leaked out of the region of the two-dimensional photonic crystal is returned to the inside of the region by the reflection of the photonic band edge.

The one-dimensional photonic crystal can allow one of a plurality of resonance modes in the leaked light to selectively reflect.

The one-dimensional photonic crystal can allow either one of the intersecting polarizing directions to selectively reflect or transmit in a specific wavelength.

In the structure having the photonic crystal, one pair only of the one-dimensional photonic crystals can be disposed at the positions opposed by sandwiching the two-dimensional photonic crystals.

The one-dimensional photonic crystals can be disposed at all the positions disposed by sandwiching the two-dimensional photonic crystal.

The one-dimensional photonic crystals can be sandwiched by the members of the refractive index lower than the one-dimensional photonic crystal.

The two-dimensional photonic crystal and the one-dimensional photonic crystals can be disposed at a position in which the light resonated in harmony in the two-dimensional phonic crystal region and the light returned by the one-dimensional photonic crystal are mutually enhanced or weakened in intensity.

The two-dimensional photonic crystals can have an array structure wherein a plurality of two-dimensional photonic crystals is disposed in the same plane and the one-dimensional photonic crystals are disposed among the disposed two-dimensional photonic crystals.

The present invention is directed to a surface-emitting laser, comprising a structure having the photonic crystals.

According to the present invention, a structure having a photonic crystal capable of reflecting efficiently the light leaked in the in-plane direction in small size and being re-used, and a surface-emitting laser including a structure having a photonic crystal can be realized.

Further features of the present invention will become apparent from the following description of exemplary embodiments with reference to the attached drawings.

DESCRIPTION OF THE EMBODIMENTS

Next, embodiments of the present invention will be described.

First Embodiment

As a first embodiment of the present invention, a description will be made on a structure including a two-dimensional photonic crystal in which components different in refractive index are arranged with two-dimensional periods, and a structure which radiates a light in the direction perpendicular to a resonance direction of a light propagated in the in-plane direction of the two-dimensional photonic crystal.

Figure 1:
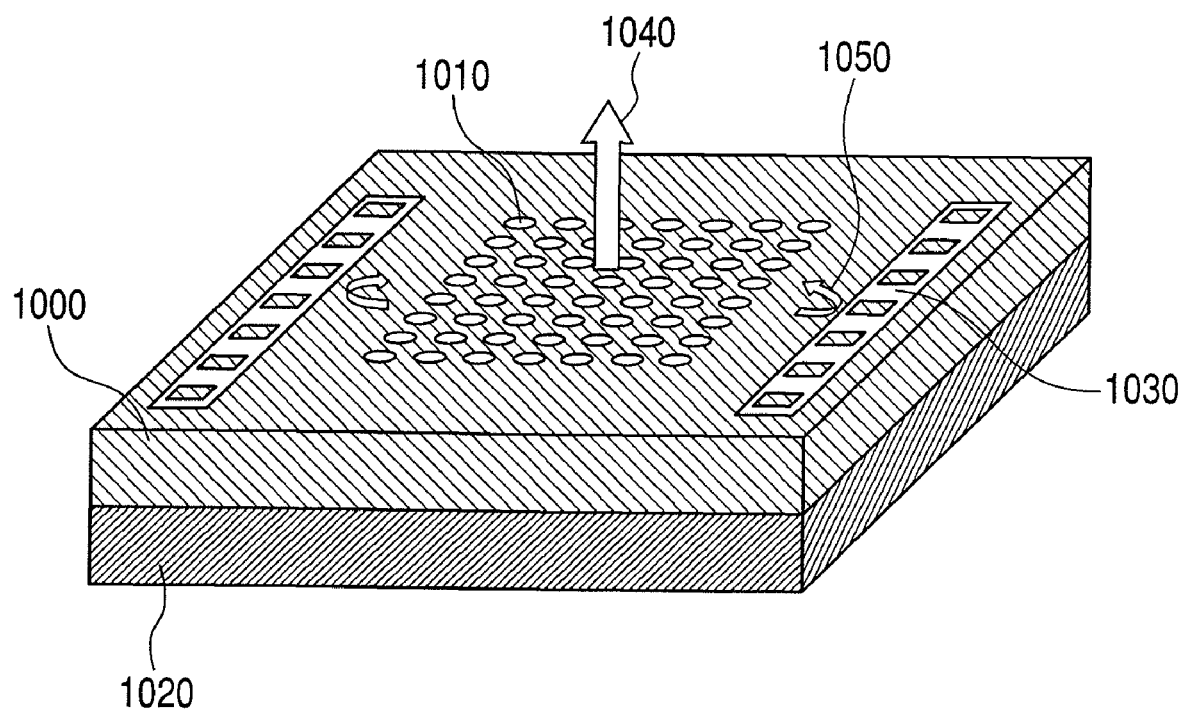
FIG. 1 is a perspective view for describing a structure having a photonic crystal in a first embodiment of the present invention.

In FIG. 1 is shown a perspective view for describing a structure having the photonic crystal in the present embodiment, where the perpendicular direction is denoted as 1040.

In FIG. 1, reference numeral 1000 denotes a photonic crystal layer constituted by providing a plurality of holes 1010 periodically disposed and a one dimensional period structure 1030 for a first member made of a first material having a first refractive index ($n_1$).

Further, numeral 1020 denotes a clad layer adjacent to the photonic crystal layer 1000.

If a size in the in-plane direction of the two-dimensional photonic crystal is limited, the light leaks to the outside of a region provided with the two-dimensional photonic crystal structure.

The leaked light 1050 causes losses, and leads to a characteristic deterioration of the structure.

Here, if a one-dimensional photonic crystal structure 1030 is disposed, from among the light incident on the one-dimensional photonic crystal structure, a light of the wavelength equivalent to a photonic band edge resonates in harmony, and is reflected with an efficiency of nearly 100% in theory.

As a result, by photonic band edge of the one-dimensional photonic crystal, the light propagating in the in-plane direction of the two-dimensional photonic crystal is reflected, and the light leaked into the region provided with the two-dimensional photonic crystal structure can be returned.

Next, a reflection at the photonic band edge in the photonic crystal utilized in the present embodiment will be described.

In the photonic crystal, a reflection of the light by the photonic band gap is well known. In the photonic crystal, there exists a photonic band gap in which the mode of the light does not exist for a specific waveband.

In that waveband, the light is unable to propagate, and is reflected without being able to deeply enter the photonic crystal.

Figure 10A:
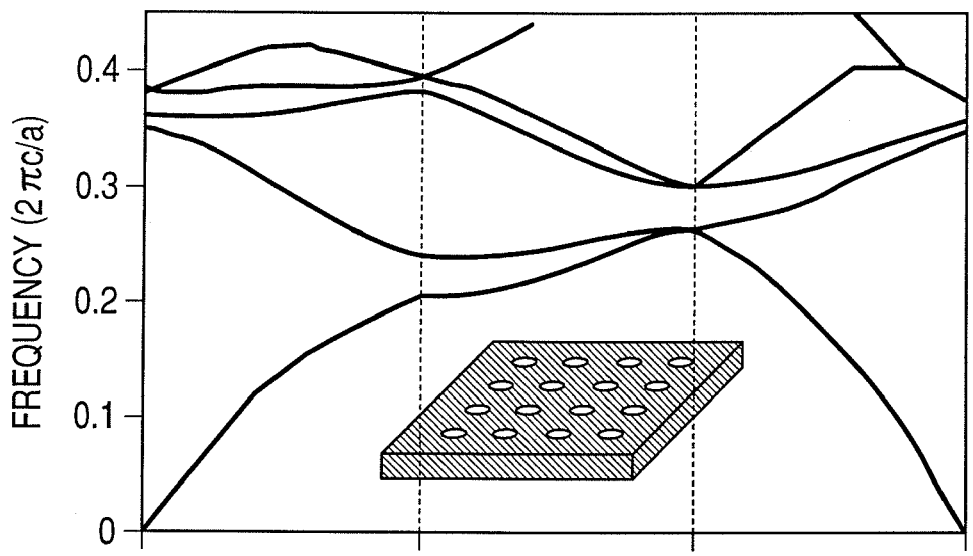
FIGS. 10A and 10B are photonic band views describing a photonic band gap and a photonic band edge.
Figure 10B:
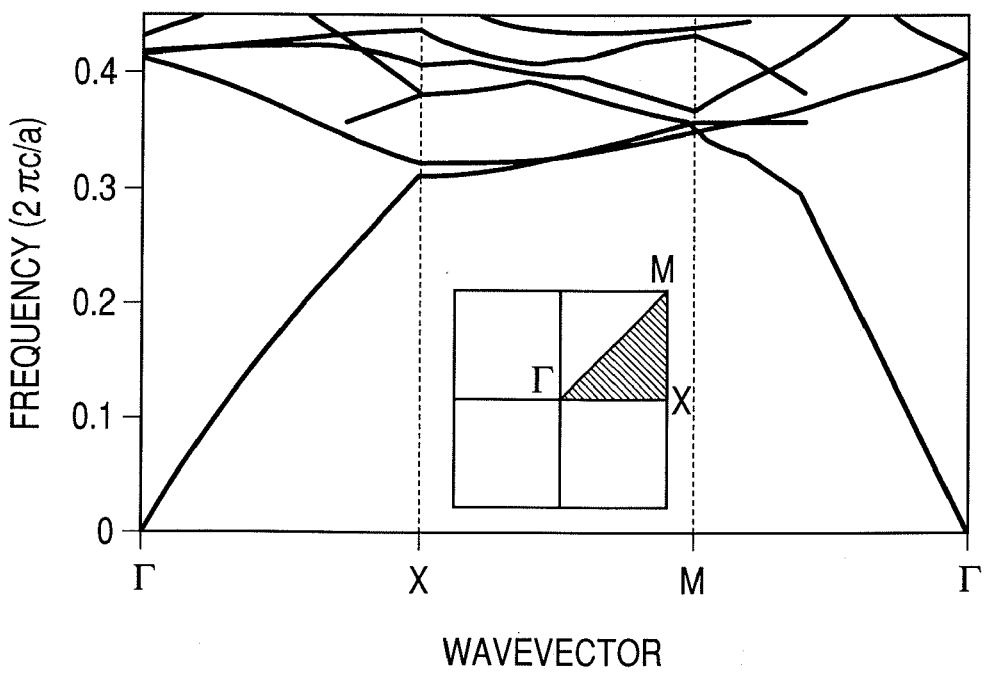

FIGS. 10A and 10B show photonic band views of a two-dimensional photonic crystal slab described in Physical Review B, vol. 65, p. 235112, (2002).

FIGS. 10A and 10B are band views of a mode (FIG. 10A) having an electric-field component and a mode (FIG. 10B) having a magnetic field component parallel to a slab surface of the two-dimensional photonic crystal slab having a lattice constant a, a hole radius of 0.2a, a slab of 0.5a in thickness, and a slab dielectric constant 12.

In the structures of FIGS. 10A and 10B, though there does not exist a photonic band gap in a strict sense which prohibits a propagation of the light in all directions, there exists a photonic band gap in a restricted sense which prohibits a propagation in a specific direction.

For example, in the vicinity of a normalized frequency 0.2 of FIG. 10A, there is a frequency band in which no mode of propagating the light to a Γ-x direction exists, and the light of this frequency band is reflected without being able to be propagated in the Γ-x direction.

On the other hand, the reflection at the photonic band edge occurs by a principle different from the reflection by the photonic band gap.

The light incident on the photonic crystal is coupled with a mode located upper than a light line so as to be converted into a mode wave-guided in the photonic crystal.

After that, the light is coupled with an emission mode so as to be emitted again out of the photonic crystal.

By the interference between a light directly transmitting without being coupled with a wave guide mode and a light once coupled with the wave guide mode and emitted again to the outside, peculiar transmission and reflection phenomenon, for example, a reflection of efficiency 100% occur.

This reflection phenomenon may occur in other than the photonic band edge, and in that case, the incidence and the reflection directions of the light have specific angles for the crystal surface of the photonic crystal.

The mode equivalent to a perpendicular incidence is a mode located at the points Γ of FIGS. 10A and 10B, and is equivalent to the photonic band edge.

In the structure having the photonic crystal of the present embodiment, the reflection at this photonic band edge is utilized.

One of the advantages carried by the structure of the present embodiment is that a size of the structure for the reflection can be made small as compared with the other structures.

For example, as compared with the structure, which utilizes the photonic band gap of Japanese Patent Application Laid-Open No. 2003-273456, there is an advantage that the structure for the reflection can be made small.

That is, according to the structure of Japanese Patent Application Laid-Open No. 2003-273456, as described above, since the light is reflected by multiple reflection by the periodic structure, as the necessary reflectance is increased, the necessary number of periods is increased, and as a result, the size ends up becoming large.

Hereinafter, these points will be described further in detail.

According to our studies, in a two-dimensional square lattice photonic crystal having a lattice constant of 105 nm, a hole radius of 21 nm, a refractive index of 2.5 of a base material, and a refractive index of 1 of a columnar hole, to obtain a reflectance of 99.9% or more in the case of a TE-like mode (mode whose oscillation direction of the electric field is an in-planer direction) of the wavelength of 500 nm in incident light, the number of the periods of 22 or more is required for the travelling direction of the leaked light. This is 2.3 μm or more in terms of the length.

FIGS. 2A to 2D show views for describing a light reflection spectrum by the photonic band gap and the photonic band edge.

Figure 2A:
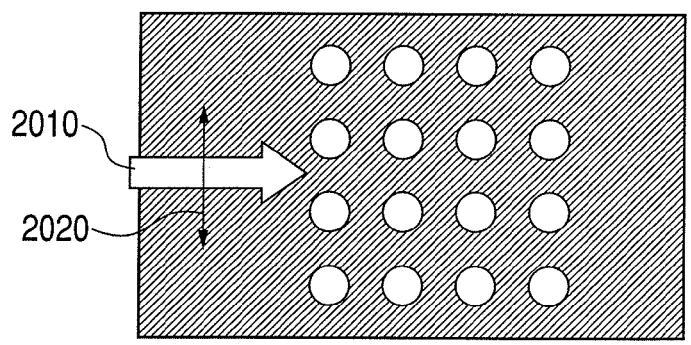
FIGS. 2A, 2B, 2C and 2D are views describing optical reflectance spectrum by photonic band gap and photonic band edge.

FIG. 2A is a view showing a layout diagram in the case where a TE-like mode light 2010 is incident on the two-dimensional photonic crystal of the above described structure. Reference numeral 2020 denotes a polarized direction.

Figure 2C:
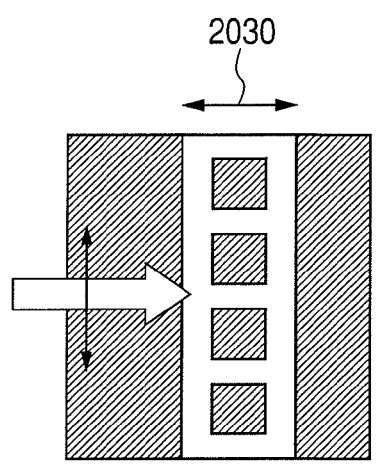
Figure 2B:
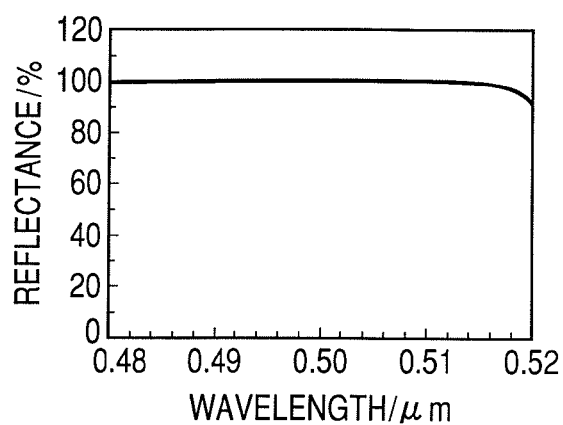

Further, FIG. 2B is a view showing a reflection spectrum calculation result.

In the vicinity of the wavelength of 500 nm, a reflectance of 99.9% is obtained.

On the other hand, in the structure reflecting by utilizing the photonic band edge used in the present invention, even when the length for the travelling direction of the leaked light is approximately some fractions of the case where the photonic band gap is utilized, an approximately 100% of reflection can be obtained.

FIG. 2C is a view showing a layout diagram of the case where the TE-like mode light is incident on the one-dimensional photonic crystal. Reference numeral 2030 denotes a length of the same crystal.

Figure 2D:
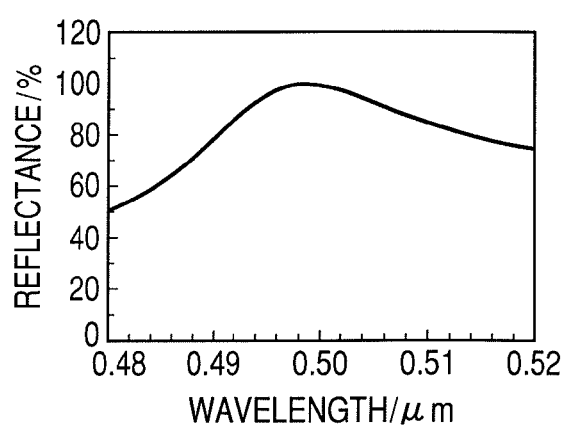

Further, FIG. 2D is a view showing a reflection spectrum calculation result.

A length including also a groove for the travelling direction of the leaked light of the one-dimensional photonic crystal is 640 nm, and a lattice period is 333 nm. In the vicinity of the wavelength of 500 nm, a reflectance of approximately 100% is obtained.

When a comparison is made between FIGS. 2B and 2D, FIG. 2D is narrower in the waveband showing a high reflectance. This can make a reflection high in wavelength selectivity possible.

In the structure of the present embodiment, the TE-like mode and the TM-like mode can be allowed to be also selectively reflected.

Figure 3A:
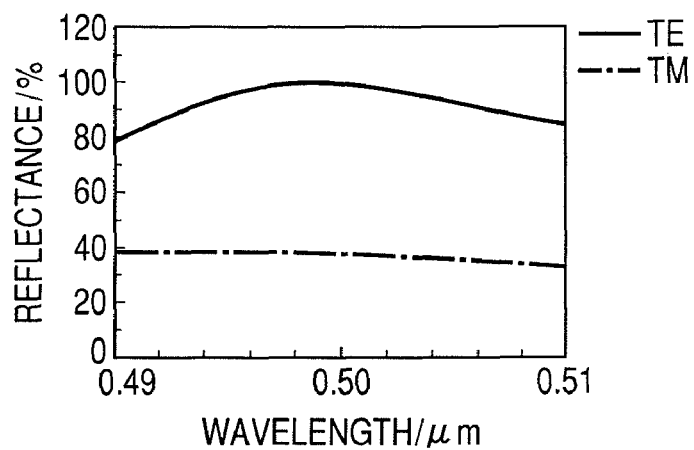
FIGS. 3A, 3B and 3C are graphs showing a calculation result of the reflectance spectrum of three kinds of structures of one-dimensional photonic crystal structure in the first embodiment of the present invention.
Figure 3B:
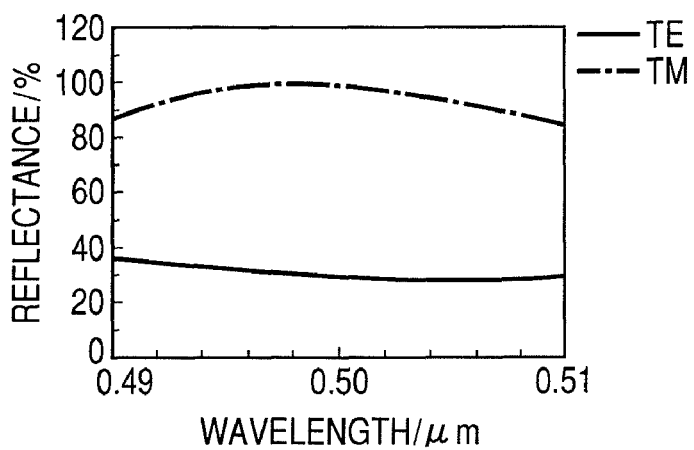
Figure 3C:
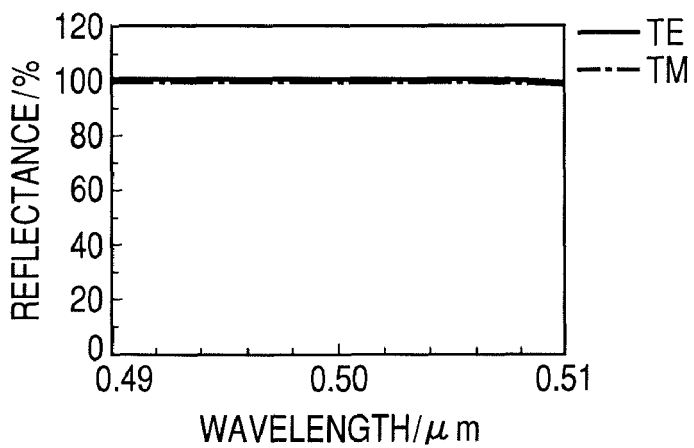

FIGS. 3A to 3C show calculation results of the reflection spectrum of the three kinds of the structures.

FIG. 3A shows a reflection spectrum calculation result of the one-dimensional photonic crystal having a lattice period of 333 nm, a length of 140 nm of a high refractive index member of the direction perpendicular to a periodic direction, and a length of 167 nm of a high refractive index member of the periodic direction.

FIG. 3B shows a reflection spectrum calculation result of the one-dimensional photonic crystal having a lattice period of 333 nm, a length of 150 nm of a high refractive index member of the direction perpendicular to a periodic direction, and a length of 217 nm of a high refractive index member of the periodic direction.

FIG. 3C shows a reflection spectrum calculation result of the wavelength equivalent to the photonic band gap of the two-dimensional square lattice photonic crystal described above.

In FIG. 3C, both the TE-like mode and the TM-like mode similarly show a high reflectance.

On the other hand, in FIG. 3A, the light only of the TE-like mode is strongly reflected, and in FIG. 3B, the light only of the TM-like mode is strongly reflected.

In this manner, in the structure of the present invention, by the change of the design, the TE-like mode only or the TM-like mode only can be selectively reflected.

This simulation was conducted by using an FDTD method and a transfer matrix method.

In an optical resonance mode of the two-dimensional photonic crystal, there exists a plurality of modes.

In the present specification, the mode such as forming a stationary wave in the photonic crystal structure is defined as an optical resonance mode or simply as a resonance mode, and the traveling direction of a traveling wave and a reflected wave constituting the stationary wave is defined as a resonance direction.

The resonance mode is divided into the TE-like mode and the TM-like mode depending on the polarized direction, and the wavelength of each mode is generally different.

Further, with respect to an order of the wave guide mode as well as an order of diffraction, there exists a plurality of orders of the lowest to the highest, and in general, each mode has a different wavelength, and it is known that the lower the order is, the longer wavelength side it is located at.

If the characteristic of the above-described one-dimensional photonic crystal is utilized, from among a plurality of resonance modes, the light only of the mode having specific polarized direction and wavelength can be selectively reflected.

Next, a layout of the one-dimensional photonic crystal constituting the structure of the present embodiment will be described.

This one-dimensional photonic crystal is provided in a direction perpendicular to the emitting direction of the light, out of the region of the two-dimensional photonic crystal in the structure, and moreover, in a direction perpendicular to the resonance direction of the light.

At this time, the one-dimensional photonic crystal may be disposed so as to surround the whole or the part of the two-dimensional photonic crystal.

Figure 5A:
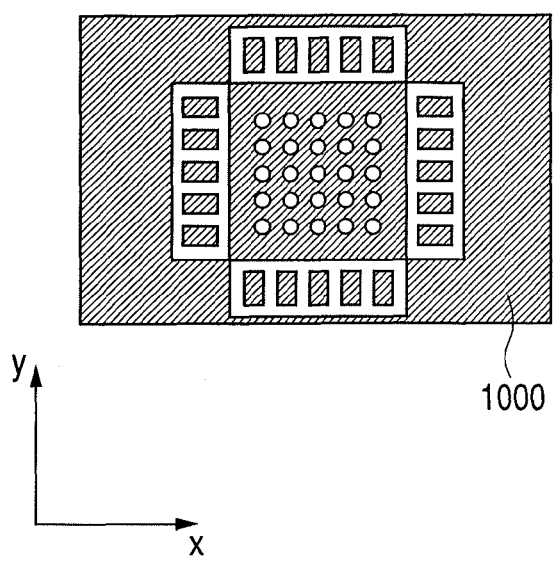
FIGS. 5A and 5B are schematic diagrams describing the layout of the one-dimensional photonic crystal structure in the first embodiment of the present invention.

For example, as shown in FIG. 5A, the one-dimensional photonic crystal may be structured to be disposed at all the positions opposed by sandwiching the two-dimensional photonic crystals.

Figure 5B:
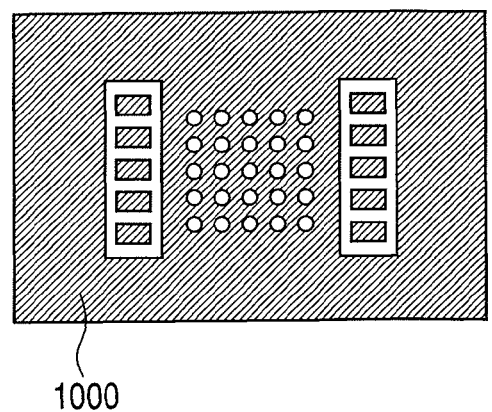

Further, as shown in FIG. 5B, the structure may be such that, by a pair of one-dimensional photonic crystals opposed to each other, the light of an x direction is reflected, and the light of a y direction is leaked.

To realize a high reflectance in the one-dimensional photonic crystal, it is necessary to confine the light to the inside of the one-dimensional photonic crystal.

Figure 4A:
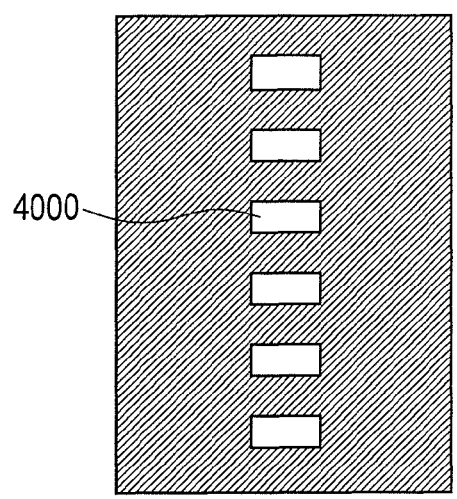
FIGS. 4A and 4B are schematic diagrams describing the one-dimensional photonic crystal structure in the first embodiment of the present invention.
Figure 4B:
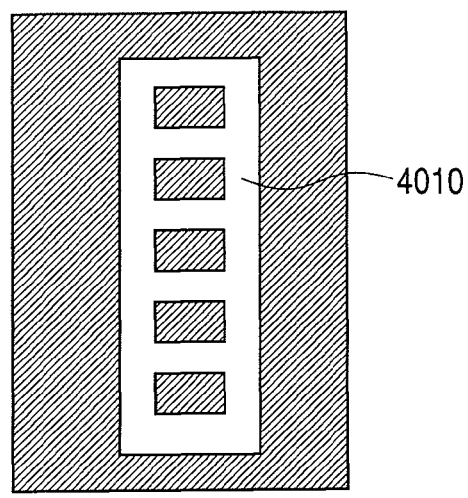

To that end, instead of simply forming a periodic structure 4000 as shown in FIG. 4A, but as shown in FIG. 4B, a structure having both ends sandwiched by a member 4010 of a low refractive index is desirable. The member may be the air or may be filled by a transparent resin and the like.

Further, in the present embodiment, the two-dimensional photonic crystal and the one-dimensional photonic crystal can be structured such that the light resonated in harmony in the two-dimensional photonic crystal region and the light returned by the one-dimensional photonic crystal are disposed at a position to be mutually enhanced or weakened in intensity.

For example, a distance between the two-dimensional photonic crystal and the one-dimensional photonic crystal regions is disposed such that the light leaked from the two-dimensional photonic crystal and reflected by the one-dimensional photonic crystal and returned again to the two-dimensional photonic crystal matches the light in phase which is in the two-dimensional photonic crystal.

Specifically, an optical path length in the round tip from the end of the two-dimensional photonic crystal to the one-dimensional photonic crystal matches an integer multiple of the wavelength in consideration of the phase change at the reflection time also.

On the contrary, when the optical path length is disposed so as to be shifted from the integer multiple to a half of the wavelength, the light in the two-dimensional photonic crystal and the returned light work to offset each other.

By utilizing this fact, a certain specific mode only can be made hard to oscillate.

For example, the light only of the TM-like mode is designed to selectively reflect by the one-dimensional photonic crystal, and the reflected light is disposed at a position to offset the light in the two-dimensional photonic crystal, so that the oscillation of the TM-like mode can be suppressed.

According to the structure including the photonic crystal in the present embodiment, by sandwiching the one-dimensional photonic crystal structure between the two-dimensional photonic crystal structures, the leaked light can be almost completely reflected, and the interference between the two-dimensional photonic crystal laser elements can be reduced.

Further, according to the structure of the present embodiment, as compared with the structure which is allowed to reflect by utilizing the photonic band gap, even a small structure can be allowed to reflect with high efficiency, and therefore, it is suitably disposed in the two-dimensional photonic crystal structure array of a narrow pitch.

Further, according to the structure of the present embodiment, since each of the two-dimensional photonic crystal structures is mutually electrically insulated by a groove containing the one-dimensional photonic crystal, this enables it to function also as electrical element isolation.

Second Embodiment

As a second embodiment, a surface-emitting laser constituted by containing a structure having a photonic crystal of the present invention will be described.

Figure 6A:
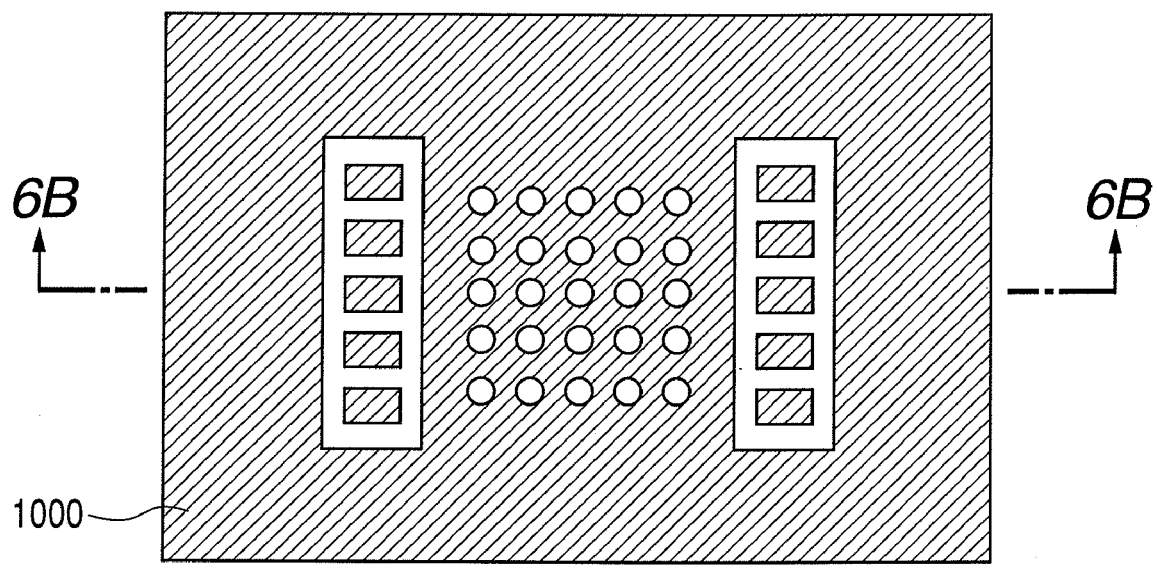
FIGS. 6A and 6B are schematic diagrams describing a surface-emitting laser using a structure having a photonic crystal of the present invention in a second embodiment of the present invention.
Figure 6B:
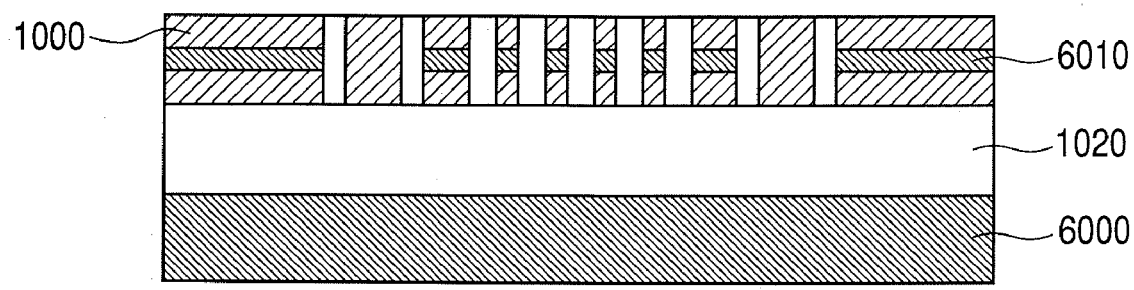

FIGS. 6A and 6B show schematic diagrams of a surface-emitting laser in the present embodiment.

FIG. 6A is a top view, and FIG. 6B is a sectional view cut along the line 6B-6B.

In FIGS. 6A and 6B, reference numeral 6000 denotes a substrate, numeral 1020 a clad layer, numeral 6010 an active layer, and numeral 1000 a photonic crystal layer.

In the surface-emitting layer of the present embodiment, the light generated in the active layer 6010 forms and amplifies a stationary wave in a two-dimensional photonic crystal, thereby to realize a laser oscillation.

An emission wavelength in the active layer is decided by the material of the active layer and the layer configuration, and the wavelength forming the stationary wave in the two-dimensional photonic crystal is decided by a lattice period and a hole diameter.

To allow the laser oscillation to be performed, it is necessary to design all these wavelengths to be matched.

Further, by matching a reflection wavelength of the one-dimensional photonic crystal with a laser oscillation wavelength, the leaked light is reflected by the one-dimensional photonic crystal, and is returned to the two-dimensional photonic crystal, thereby enabling it to be re-used again.

Next, the active layer, the clad layer, the substrate, and the like in the surface-emitting laser of the present embodiment will be described.

The active layer 6010 is of a multiple quantum well structure using materials such as GaInP/AlGaInP and GaN/InGaN.

The clad layer 1020 is, for example, composed of AlGaInP, AlGaN, and the like.

The substrate 6000 is, for example, composed of GaAs, GaN, and the like.

The surface-emitting layer according to the present embodiment can be driven by a light excitation system or a current injection system. In the FIGS. 6A and 6B, an electrode and the like are omitted.

EXAMPLES

Hereinafter, examples of the present invention will be described.

Example 1

In the example 1, a two-dimensional photonic crystal surface-emitting laser constituted by applying the present invention will be described.

Figure 7A:
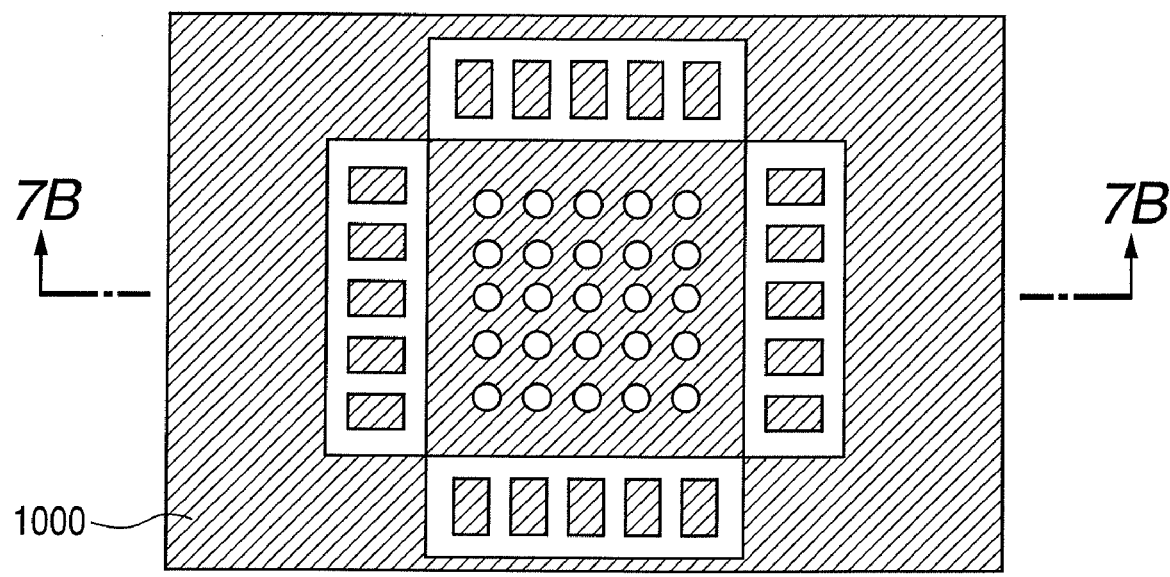
FIGS. 7A and 7B are schematic diagrams describing a two-dimensional photonic crystal surface-emitting laser in the first embodiment of the present invention.
Figure 7B:
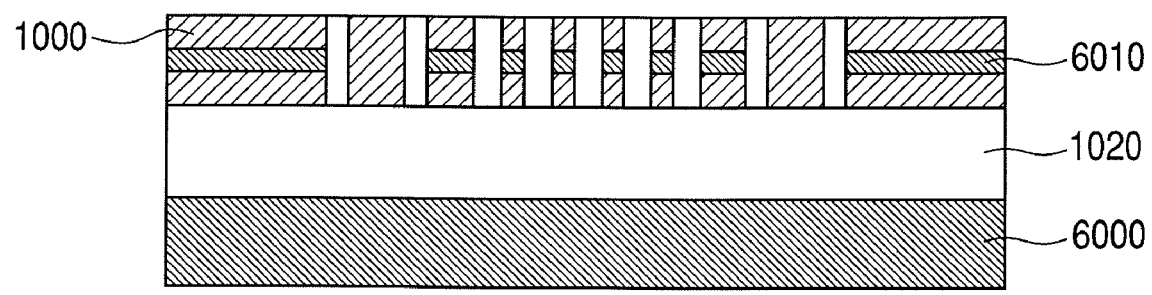

FIGS. 7A and 7B show schematic diagrams describing the two-dimensional photonic crystal surface-emitting laser in the present example. FIG. 7A is a top view, and FIG. 7B is a sectional view cut along the line 7B-7B.

In FIGS. 7A and 7B, reference numeral 1000 denotes a photonic crystal layer containing a two-dimensional photonic crystal structure constituted by providing columnar holes on a layer composed of $Al_{0.5}GaAs$ in the shape of a square lattice.

A thickness of the layer is 250 nm, an interval of the holes is 210 nm, a radius of the hole is 42 nm, and a depth of the hole is 250 nm. Further, numeral 1020 denotes a clad layer composed of $Al_{0.9}GaAs$. Numeral 6010 denotes a GaInP/AlGaInP multiple quantum well active layer.

In the two-dimensional photonic crystal structure, the light equivalent to the wavelength of 670 nm in vacuum has an optical resonance mode, and forms a stationary wave.

By matching an emission wavelength of the active layer with that wave, a laser is oscillated, and a laser light is emitted in an emission direction perpendicular to the two-dimensional photonic crystal surface, that is, the plane having a periodic structure.

When a size of the in-plane direction of the two-dimensional photonic crystal structure is limited, the light is waveguided in the same direction as the light resonance direction in the two-dimensional photonic crystal structure, and is leaked out of the region in which the two-dimensional photonic crystal structure is provided.

The periphery of the two-dimensional photonic crystal structure is disposed with the one-dimensional photonic crystal structure having a one-dimensional refractive index periodic structure.

This one-dimensional photonic crystal structure allows one out of the plurality of resonance modes in the leaked light to be selectively reflected.

That is, by matching the reflective wavelength of the one-dimensional photonic crystal structure with the resonance mode wavelength of the two-dimensional photonic crystal structure, the light leaked in the in-plane direction can be returned again to the inside of the two-dimensional photonic crystal structure, thereby contributing to laser oscillation.

If a size of the one-dimensional photonic crystal structure is assumed to be a lattice period of 447 nm, a length of 107 nm of the high refractive index member in the direction perpendicular to the periodic direction, and a length of 225 nm of the high refractive index member in the periodic direction, a high refractive index can be obtained in the vicinity of a wavelength of 670 nm.

Here, the mode (forms the stationary wave) in the two-dimensional photonic crystal structure can be divided into a TE-like mode and a TM-like mode depending on the polarized direction.

In general, the TE-like mode and the TM-like mode are located at the wavelengths slightly different, and hence, a mode hopping and the like occur, thereby to become factors of unstable laser oscillation wavelength.

As described above, in the one-dimensional photonic crystal structure, in a specific wavelength, one of the polarized directions that are intersecting at right angles can be allowed to selectively reflect or transmit. In the structure according to the present example, the TE-like mode only is allowed to reflect with high efficiency.

As a result, comparing with the light of the TM-like mode, the loss of the TE-like mode can be reduced, and by making the oscillation much easier by the TE-like mode, the mode hopping and the like are made hard to occur, thereby enabling to oscillate stably with a single wavelength.

Example 2

In a second example, a two-dimensional photonic crystal surface emitting laser of an embodiment different from the first example constituted by applying the present invention will be described.

Figure 8:
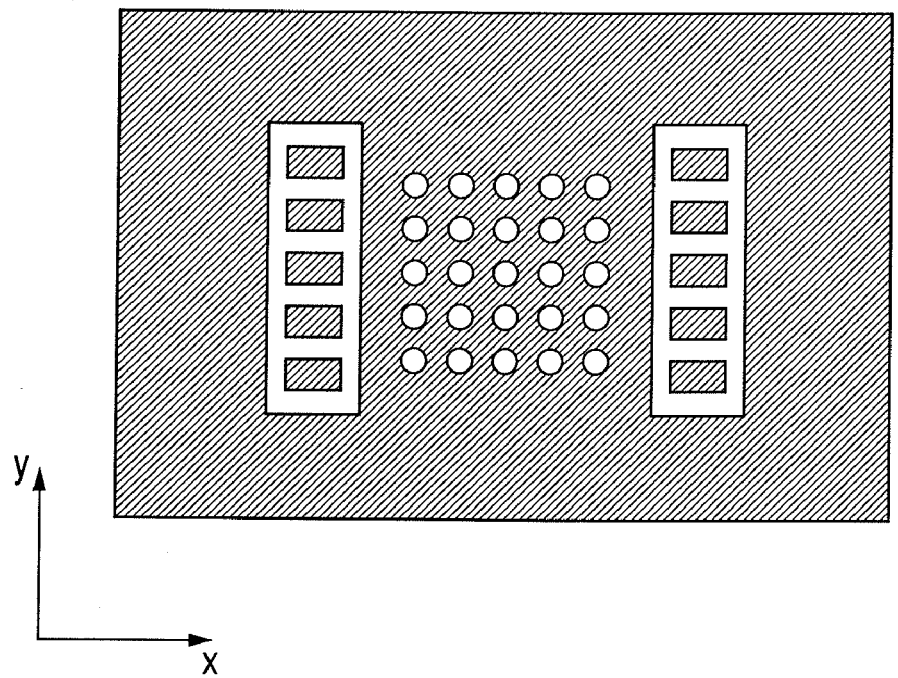
FIG. 8 is a schematic diagram describing the two-dimensional photonic crystal surface-emitting laser in a second example of the present invention.

FIG. 8 shows a schematic diagram describing the two-dimensional photonic crystal surface-emitting laser in the present example.

The layer structure in the present example and the structure of a two-dimensional photonic crystal are the same as the first example.

The second example is different from the first example in that one pair only of one-dimensional photonic crystal structures is disposed at the positions opposed by sandwiching the two-dimensional photonic crystal structure.

Even if it is the light of the same TE-like mode, the polarized direction of the in-plane is different depending on the travelling direction.

Specifically, the light of a TE-like mode travelling in the x direction has a polarized light of the y direction, and the light of a TE-like mode travelling in the y direction has a polarized light of the x direction.

From among these lights, by returning the light only travelling in the x direction, the mode having the polarized light in the y direction is excited much stronger with a result that outgoing laser light polarized in the y direction can be obtained.

Example 3

In a third example, a two-dimensional photonic crystal laser array constituted by applying the present invention will be described.

Figure 9:
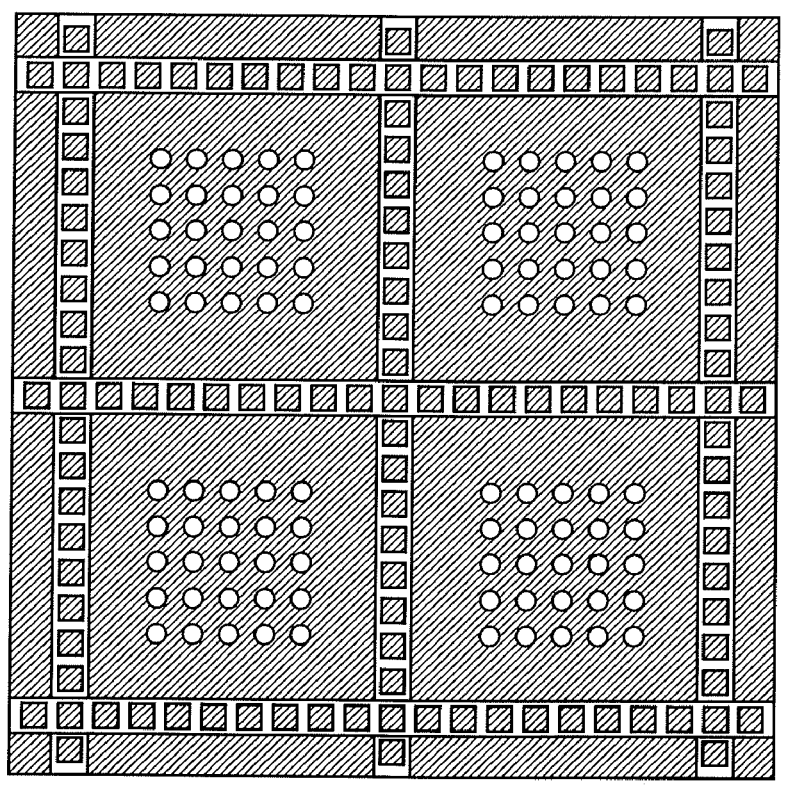
FIG. 9 is a schematic diagram describing a two-dimensional photonic crystal laser array in a third example of the present invention.

FIG. 9 shows a schematic diagram describing a two-dimensional photonic crystal laser in the present example.

The present example has an array structure wherein a plurality of two-dimensional photonic crystals is disposed in the same plane and one-dimensional photonic crystals are disposed among the plurally disposed two-dimensional photonic crystals.

In this manner, among the plurality of two-dimensional photonic crystal structures, the one-dimensional photonic crystal structures are disposed, and both sides of the one dimensional photonic crystal structures are sandwiched by grooves of the air.

The layer structure and the structures of the one-dimensional and two-dimensional photonic crystals are the same as the first example.

When the two-dimensional photonic crystal lasers are array-disposed, there are often the cases where the light leaked from each of the two-dimensional photonic crystal laser elements affects the adjacent two-dimensional photonic crystal laser elements, thereby deteriorating the characteristic of each element.

According to the structure of the present example, by sandwiching the one-dimensional photonic crystal structures between the two-dimensional photonic crystal structures, the leaked light can be almost completely reflected, and the interference between the two-dimensional photonic crystal laser elements can be reduced.

Further, according to the structure of the present example, as described above, as compared with the structure in which the reflection is performed by utilizing a photonic band gap, even the small structure can reflect with high efficiency, and therefore, it is suitably disposed in the two-dimensional photonic crystal array layout of a narrow pitch.

Further, according to the structure of the present example, since each of the two-dimensional photonic crystal structures is mutually electrically insulated by a groove containing the one-dimensional photonic crystal, this enables it to function also as electrical element isolation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-206984, filed Aug. 8, 2007, which is hereby incorporated by reference herein in its entirety.

What is claimed is:
1. A structure comprising:
 a two-dimensional photonic crystal in which structures having different refractive indices are disposed at a two-dimensional period;
 an emitting structure emitting in a direction perpendicular to a resonance direction of light propagating in an in-plane direction of the two-dimensional photonic crystal; and
 a one-dimensional photonic crystal in which components having different refractive indices are arranged at a one-dimensional period,
  wherein the one-dimensional photonic crystal is provided in a region outside of a region of the two-dimensional photonic crystal in the structure,
  wherein the one-dimensional photonic crystal is sandwiched by members with a refractive index lower than that of the one-dimensional photonic crystal, wherein the one-dimensional photonic crystal allows either one of a TE-like mode and a TM-like mode to selectively reflect, and wherein light of a mode that includes the selectively reflected mode among light that is leaked from the light propagating in the in-plane direction of the two-dimensional photonic crystal and that is leaked from the region of the two-dimensional photonic crystal is returned to inside of the region by reflection via a photonic band edge of the one-dimensional photonic crystal.

2. The structure according to claim 1, wherein one pair only of one-dimensional photonic crystals is disposed at positions opposed by sandwiching the two-dimensional photonic crystal.

3. The structure according to claim 1, wherein one-dimensional photonic crystals are disposed at all positions opposed by sandwiching the two-dimensional photonic crystal.

4. The structure according to claim 1, wherein the two-dimensional photonic crystal and the one-dimensional photonic crystal are respectively disposed at positions at which light that resonated in the two-dimensional phonic crystal region and light returned by the one-dimensional photonic crystal are mutually enhanced or weakened in intensity.

5. The structure according to claim 1, wherein the structure is incorporated in an arrangement in which two-dimensional photonic crystals have an array structure such that a plurality of the two-dimensional photonic crystals is disposed in a same plane and one-dimensional photonic crystals are disposed among the plurality of two-dimensional photonic crystals disposed in the same plane.

6. The structure according to claim 1, wherein the structure is incorporated in a surface-emitting laser.

* * * * *